United States Patent
York

(10) Patent No.: US 6,674,321 B1
(45) Date of Patent: Jan. 6, 2004

(54) CIRCUIT CONFIGURATION FOR DC-BIASED CAPACITORS

(75) Inventor: Robert A. York, Santa Barbara, CA (US)

(73) Assignee: Agile Materials & Technologies, Inc., Goleta, CA (US)

( * ) Notice: Subject to any disclaimer, the term of this patent is extended or adjusted under 35 U.S.C. 154(b) by 0 days.

(21) Appl. No.: 10/211,765

(22) Filed: Aug. 1, 2002

Related U.S. Application Data

(60) Provisional application No. 60/335,191, filed on Oct. 31, 2001.

(51) Int. Cl.$^7$ ................................................. H03H 1/00
(52) U.S. Cl. ..................... 327/586; 327/334; 333/172
(58) Field of Search .................... 327/334, 586; 333/165, 166, 167, 172, 173

(56) References Cited

U.S. PATENT DOCUMENTS

| | | | | |
|---|---|---|---|---|
| 3,388,336 A | * | 6/1968 | Mattern | 330/10 |
| 4,621,205 A | * | 11/1986 | Miller | 327/586 |
| 5,378,937 A | * | 1/1995 | Heidemann et al. | 327/306 |
| 5,378,939 A | * | 1/1995 | Marsland et al. | 327/91 |
| 5,406,237 A | * | 4/1995 | Ravas et al. | 333/218 |
| 5,990,761 A | * | 11/1999 | Hamparian et al. | 333/164 |
| 6,225,861 B1 | * | 5/2001 | Kawai | 327/586 |

OTHER PUBLICATIONS

Acikel, Baki et al., "A New High Performance Phase Shifter using (Ba$_x$Sr$_{1-x}$ TiO$_3$ Thin Films," *IEEE Microwave and Wireless Components Letters*, vol. 12, No. 7, Jul. 2002, pp. 237–239.

Erker, ErichG. et al., "Monolithic Ka–Band Phase Shifter Using Voltage Tunable BaSrTiO3 Parallel Plate Capacitors," *IEEE Microwave and Guided Wave Letters*, vol. 10, No. 1, Jan. 2000, pp. 10–12.

Liu, Yu et al., "BaSrTioO$_3$ Interdigitated Capacitors for Distributed Phase Shifter Applications," *IEEE Microwave and Guided Wave Letters*, vol. 10, No. 11, Nov. 2000, pp. 448–450.

Liu, Yu et al., "High–performance and Low–cost Distributed Phase Shifters Using Optimized BaSrTiO$_3$ Interdigitated Capacitors," Electrical and Computer Engineering Dept., Materials Dept., University of California at Santa Barbara, Santa Barbara, CA 93106, 14 pages [online], [retrieved on Jun. 24, 2003]. Retrieved from the Internet <URL: http://my.ece.ucsb.edu/yorklab/Publications/pubs.htm>.

Padmini, P. et al., "Realization of High Tunability Barium Strontium Titanate Thin Films by RF Magnetron Sputtering," *Applied Physics Letters*, vol. 75, Nov. 1999, pp. 3186–3188.

Serraiocco, J. et al., "Tunable Passive Integrated Circuits Using BST Thin Films," presented at IFFF 2002, International Joint Conference on the Applications of Ferroelectrics, Kyoto, Japan, May 2002, 10 pages [online], [retrieved on Jun. 24, 2003]. Retrieved from the Internet <URL: http://my.ece.ucsb.edu/yorklab/Publications/pubs.htm>.

Taylor, T.R. et al., "Impact of thermal strain on the dielectric constant of sputtered barium strontium titanate thin films," *Applied Physics Letters*, vol. 80, No. 11, Mar. 18, 2002, pp. 1978–1980.

Taylor, T.R. et al., "Optimization of RF Sputtered Barium Strontium Titanate (BST) Thin Films for High Tunability," presented at MRS Conference, Fall 1999, 2 pages [online], [retrieved on Jun. 24, 2003]. Retrieved from the Internet <URL: http://my.ece.ucsb.edu/yorklab/Publications/pubs.htm>.

(List continued on next page.)

*Primary Examiner*—Terry D. Cunningham
(74) *Attorney, Agent, or Firm*—Fenwick & West LLP

(57) ABSTRACT

A capacitive element includes two or more voltage-variable capacitors (varactors). The varactors are configured so that they are coupled in series with respect to an applied AC signal and are coupled in parallel with respect to an applied DC bias voltage. The effective capacitance of the overall capacitive element can be tuned by varying the DC bias voltage.

26 Claims, 6 Drawing Sheets

OTHER PUBLICATIONS

Taylor, T.R. et al., "RF Sputtered High Tunability Barium Strontium Titanate (BST) Thin Films for High Frequency Applications," presented at ISIF 2000 Conference, Aachen, Germany, Mar. 2000, 2 pages [online], [retrieved on Jun. 24, 2003]. Retrieved from the Internet <URL: http://my.ece.ucsb.edu/yorklab/Publications/pubs.htm>.

York, R. et al. "Microwave Integrated Circuits using Thin–Film BST," presented at ISAF Conference, Honolulu, Hawaii, Jul. 21–Aug. 2, 2000, 6 pages [online], [retrieved on Jun. 24, 2003]. Retrieved from the Internet <URL: http://my.ece.ucsb.edu/yorklab/Publications/pubs.htm>.

York, Robert A. et al., "Synthesis and Characterization of $(Ba_xSr_{1-x})Ti_{1+y}O_{3+z}$ Thin Films and Integration into Microwave Varactors and Phase Shifters," *Journal of Integrated Ferroelectrics*, vol. 34, Apr. 10, 2000, pp. 177–188.

York, Robert A. et al., "Thin–Film Phase Shifters for Low–Cost Phased Arrays," presented at Workshop on Affordability and Cost Reduction for Radar Systems, Huntsville, Alabama, Apr. 2000 and at URSI Conference, Salt Lake City, Utah, Jul. 2000, 10 pages [online], [retrieved on Jun. 24, 2003]. Retrieved from the Internet <URL: http://my.ece.ucsb.edu/yorklab/Publications/pubs.htm>.

* cited by examiner

CIRCUIT CONFIGURATION FOR DC-BIASED CAPACITORS

CROSS-REFERENCE TO RELATED APPLICATION

This application claims priority under 35 U.S.C. §119(e) to U.S. Provisional Patent Application Serial No. 60/335,191, "Thin-Film Ferroelectric Tuning Circuit," by Robert A York, filed Oct. 31, 2001.

This application relates to U.S. patent application Ser. No. 10/144,185, "Voltage-Variable Capacitor with Increased Current Conducting Perimeter," by Robert A. York, filed May 10, 2002.

The subject matter of both of the foregoing is incorporated herein by reference in their entirety.

BACKGROUND OF THE INVENTION

1. Field of the Invention

This invention relates generally to capacitive elements in which the capacitance can be varied by an applied bias voltage.

2. Description of the Related Art

Circuit elements which have a variable capacitance are a staple component in the design of electronic circuits. In one approach, the capacitance is adjusted by a bias voltage applied to the capacitive element. These voltage-variable capacitors (varactors) can be created using a number of different technologies, including technologies based on thin-film ferroelectric materials.

In the thin-film ferroelectric approach, a thin film of ferroelectric material is sandwiched between conducting electrodes. Examples of suitable ferroelectric materials include barium titanate, strontium titanate, and composites of the two, for example barium strontium titanate (BST). The capacitance value of this structure varies with the applied electric field due to the nonlinear electrical polarization characteristics of the ferroelectric film. The applied electric field is approximately given by $E=V/d$, where E is the electric field, V is the voltage applied across the varactor, and d is the thickness of the ferroelectric film. In practice, electric field strengths of up to 1 MV/cm are required to achieve useful capacitance variations, depending on the specific material composition. However, increasing the field strength further leads to device failure or reliability concerns.

In many applications, the varactor is primarily used to process AC signals and a DC bias voltage is applied across the varactor to set the capacitance of the varactor. The capacitance is tuned by varying the DC bias voltage. However, if the application is limited to low DC voltages (e.g., in battery powered applications) and it is also desirable to tune the varactor over a large range of capacitances (i.e., high "tunability"), then the dielectric film typically must be quite thin in order to achieve the required electric fields. But thin dielectric films result in low breakdown voltages and poor AC power handling. In many circuits such as power amplifiers for wireless applications, the peak AC voltage applied across the varactor can significantly exceed the DC bias voltage. For example, in current cell phones, the battery voltage is typically around 3.5V and the battery produces the DC bias voltage. Therefore, the DC bias voltage typically is limited to 3.5V or less. However, the total voltage (AC+DC) can reach over 7V.

One common approach to increasing the breakdown field in ferroelectric films has been to lightly dope the films with one or more materials. For example, Ti, Mg, Mn, and Zr have been used in BST films to increase the breakdown field. The disadvantage of this approach is that the composite material often has a greatly reduced capacitive tuning for a given applied voltage. This forces the designer to use even thinner films, thus exacerbating the breakdown issue and counteracting gains resulting from the dopants.

Another problem with varactors is that varactors are used as one component in a larger circuit. However, the DC bias voltage typically is applied at the same two terminals which are connected to the external circuit. As a result, the DC bias voltage and corresponding biasing circuitry may not be isolated from the external circuit and interference between the two may result.

Thus, there is a need for capacitive elements which are tunable using low DC bias voltages but which are also capable of handling high AC voltages. It would also be beneficial for the DC bias voltage and circuitry to be isolated from any external circuit in which the capacitive element was used. Capacitive elements based on ferroelectric thin-films typically would have the added advantages of small size, low cost and suitability for mass production.

SUMMARY OF THE INVENTION

The present invention overcomes the limitations of the prior art by providing a capacitive element based on two or more varactors. The varactors are configured so that they are coupled in series with respect to an applied AC signal, thus increasing the AC power handling capability since the total AC voltage swing is divided among all of the varactors. The varactors are coupled in parallel with respect to an applied DC bias voltage, thus maintaining high capacitive tunability with low DC voltages since each varactor experiences the full DC bias voltage.

In one embodiment, the voltage-variable capacitive element includes N (where N>1) varactors that are coupled in series to form a chain. The N+1 nodes in the chain shall be referred to as junction nodes. The capacitive element also includes a first AC node and a second AC node for receiving an AC signal. The first AC node is coupled to the first junction node and the N+1th junction node is coupled to the second AC node. The capacitive element further includes a first DC bias node and a second DC bias node for receiving the DC bias voltage. The first DC bias node is DC coupled to the odd numbered junction nodes and the second DC bias node is DC coupled to the even numbered junction nodes. In some implementations, the DC bias node(s) are coupled to the junction node(s) by AC blocking circuit elements, such as high impedance (i.e., AC blocking) resistors or inductors. In this way, the DC biasing circuitry is isolated from the AC signal. In another aspect of the invention, the AC node(s) are coupled to their respective junction node(s) by DC blocking capacitors, thus isolating the DC bias voltage from any external circuit.

The capacitive elements may be implemented using a wide variety of technologies. For example, discrete components may be used to implement some or all of the capacitive elements. However, the varactors preferably are thin-film ferroelectric varactors and the capacitive element preferably is integrated on a single substrate with the varactor.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

Figure 1:
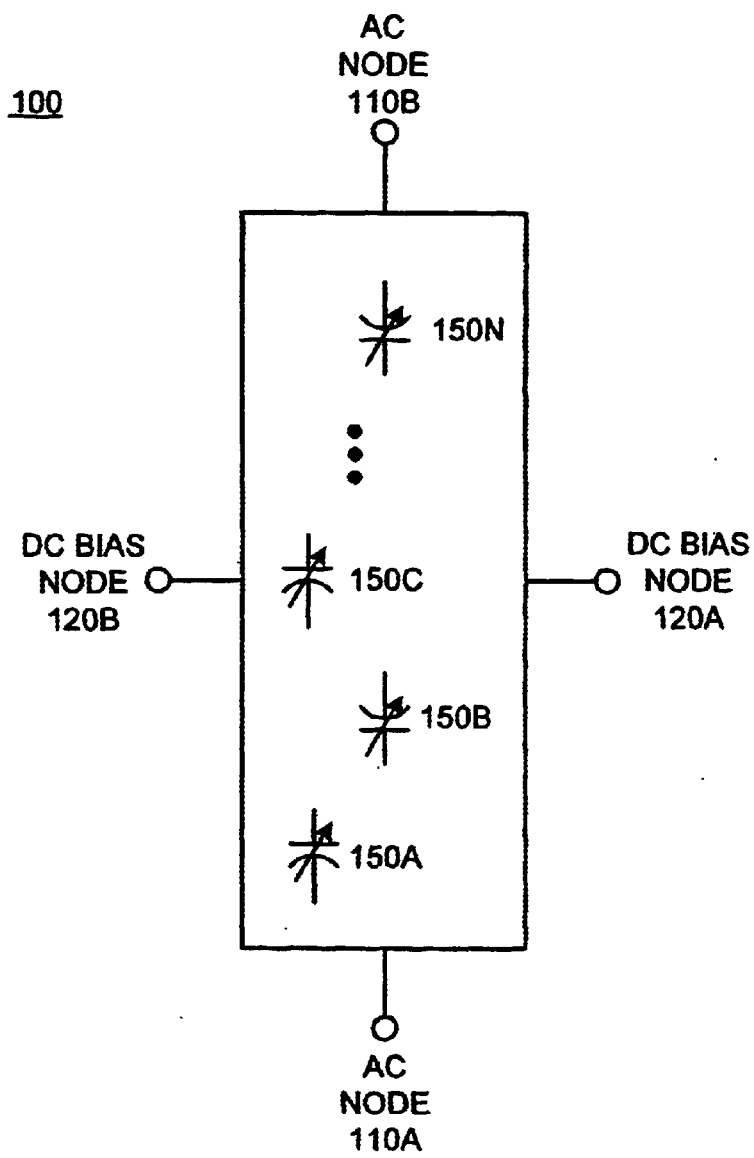
FIG. 1 is a functional diagram of a capacitive element according to the present invention.

FIG. 1 is a functional diagram of a capacitive element 100 according to the present invention. The capacitive element 100 includes four nodes, two of which shall be referred to as AC nodes 110A–110B and two of which shall be referred to as DC bias nodes 120A–120B. The element also includes at least two varactors 150A–150N. Varactors are voltage-variable capacitors, meaning that the capacitance of the varactor varies according to a DC bias voltage applied across the varactor.

The capacitive element 100 also functions as a voltage-variable capacitor. The AC nodes 110 serve as the terminals of the capacitor. An AC signal is applied to the AC nodes 110 and the element 100 primarily has a capacitive effect on the applied AC signal. The actual capacitance of element 100 is determined by a DC bias voltage applied to the DC bias nodes 120. Thus, by changing the DC bias voltage applied to DC bias nodes 120, the effective capacitance between AC nodes 110 can be tuned.

Figure 2A:
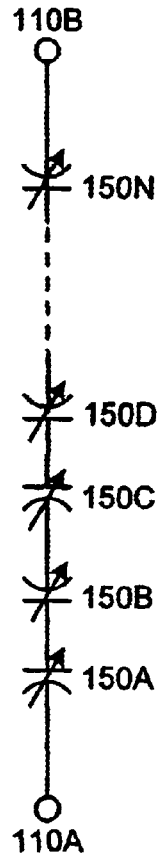
FIGS. 2A and 2B are circuit diagrams illustrating the AC and DC behavior, respectively, of the capacitive element in FIG. 1.
Figure 2B:
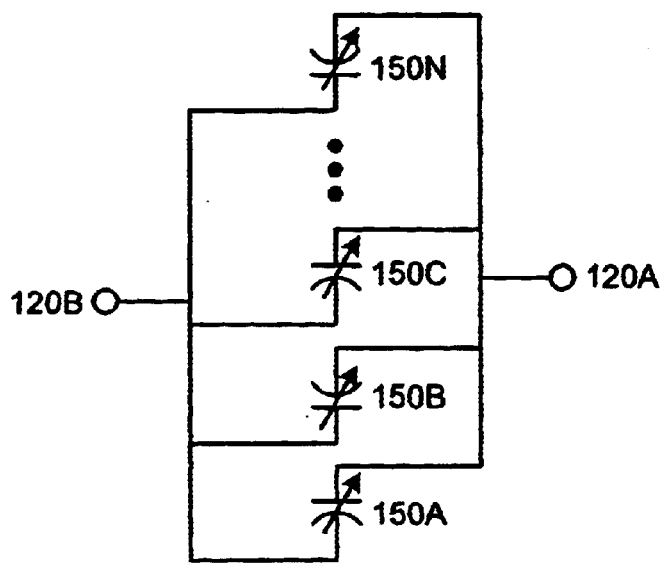

FIGS. 2A and 2B are functional diagrams further illustrating the operation of capacitive element 100. FIG. 2A illustrates the AC behavior. The circuitry within capacitive element 100 is constructed in a manner so that the N varactors 150 are coupled in series with respect to the AC signal applied to AC nodes 110. Assuming for the moment that there are no other capacitors, as is shown in FIG. 2A, the effective capacitance of element 100 is derived from the series combination of the N varactors 150. If each varactor has a capacitance of C, the effective capacitance is C/N. Furthermore, each varactor 150 experiences an AC voltage drop which is 1/N of the total AC voltage swing applied to the AC nodes 110, thus improving the power handling capability of the element 100.

FIG. 2B illustrates the DC behavior of capacitive element 100. The circuitry of element 100 is constructed so that the N varactors 150 are coupled in parallel with respect to the DC bias voltage applied to DC bias nodes 120. In this way, the full DC bias voltage is applied across each varactor 150. As a result, lower bias voltages can be used to tune the capacitance of the varactors 150. For example, if the varactors 150 were instead coupled in series with respect to the DC bias voltage and each varactor 150 experienced a DC voltage drop of 1/N of the total DC bias voltage, then the voltage applied across DC bias nodes 120 would have to be N times greater than that required by the parallel configuration shown in FIG. 2B.

It should be understood that FIGS. 1 and 2 are simplified functional descriptions. Various implementations may deviate from this model. For example, the circuits of FIGS. 2A and 2B show perfect series and parallel coupling of the varactors 150 between the AC and DC bias nodes. Implementations may not achieve this ideal result, for example due to circuit imperfections and/or additional circuit elements which affect the couplings. In most cases, circuit elements in addition to the varactors 150 are used to achieve the functionality shown in FIG. 2 but the resulting capacitive element 100 will not achieve the exact ideal behavior shown in FIG. 2. In some cases, circuit elements may be added to capacitive element 100 in order to achieve other purposes.

As another example, FIG. 1 shows the four nodes 110 and 120 as separate. This is done for clarity. In various implementations, a physical node may play the role of one or more of the nodes 110 and 120. Conversely, each node 110, 120 may be implemented by two or more physical nodes. Similarly, each varactor 150 is represented by a single symbol. In fact, each varactor 150 itself may include multiple elements, including for example series or parallel combinations of individual varactors. As a final example, it is not required that the varactors 150 be identical or have the same capacitance.

The approach described above can be implemented using many different technologies. Much of this disclosure shall focus on capacitive elements 100 based on voltage-tunable dielectric materials, including ferroelectric materials or materials derived from ferroelectric materials. The tunable dielectric layer preferably exhibits a field-dependent permittivity in a (non-hysteretic) paraelectric state over a useful temperature range (e.g., −30 C to +90 C). In the disclosure, particular emphasis will be given to integrated implementations using thin-film ferroelectric varactors 150. However, the invention is not limited to this specific technology. The principles described here are generally applicable to many types of voltage-variable capacitors 150, including those which are not thin-film, not ferroelectric and/or not integrated. The principles are not specific to a particular choice of tunable dielectric material, film thickness or fabrication sequence. Examples of other types of varactor technology include tunable or switchable capacitors using MEMS (micro-electromechanical systems) technology.

The approach has many advantages. For example, it improves the AC power handling capability of the capacitive element 100 without reducing the capacitive tuning range achievable by a given range of DC bias voltages. In contrast, consider the alternatives. In thin-film technology, the capacitance of the varactor is the result of a dielectric thin-film. The AC power handling capability of the varactor is typically limited by the breakdown voltage for the thin-film. This breakdown voltage can be increased by increasing the thickness of the film. However, the capacitive tuning is typically dependent on the electric field in the film. Increasing the film thickness results in a lower electric field for a given DC bias voltage, thus reducing the capacitive tuning range. Therefore, increasing the AC power handling capability reduces the capacitive tuning range. In the approach described here, the AC power handling capability can be increased without reducing the capacitive tuning range.

In addition, in many implementations, the DC bias voltage is electrically isolated from the AC signal in order to simultaneously achieve the AC series coupling and DC parallel coupling shown in FIG. 2. As a result, the DC bias voltage and biasing circuitry typically will also be isolated from the external circuit into which the capacitive element 100 is integrated. This reduces any adverse effects caused by the DC biasing on the external circuit, or vice versa, and allows the capacitive element 100 to be easily incorporated into a wide variety of external circuits.

The combination of good AC power handling and low DC bias voltage makes the capacitive element 100 suitable for many applications. Implementation using ferroelectric thin-film technology adds the advantages of small size and a high degree of integration. As a result, the capacitive element 100 is well suited for battery-operated devices, which typically require low operating voltages. It is also appropriate for handheld wireless devices, for example to adjust the impedance level in the power-amplifier circuit to maintain high power and high efficiency, and hence long battery life. With the addition of series- or parallel-connected inductors, a tunable resonator can be formed for use in impedance matching and filter networks. The capacitive element 100 can also be used to compensate for manufacturing tolerances, thus improving yields and reducing costs.

Two example applications concern RF communications. In one example, the capacitive element 100 is used in a tunable reactive matching network for RF power amplifiers. In the other, the capacitive element 100 is used in a tunable filter. In both cases, the capacitive element increases power handling and reduces intermodulation distortion while maintaining low DC bias voltage. Other applications (including applications at frequencies other than RF) will be apparent.

FIGS. 3–9 are examples of different embodiments of capacitive element 100. In many of these examples, high-impedance resistors and/or inductors are used as AC blocking circuit elements in order to isolate the AC signal from the DC bias circuitry and DC blocking capacitors are used to isolate the DC bias voltage from the external circuit (i.e., the circuit connected to the AC nodes).

Figure 3:
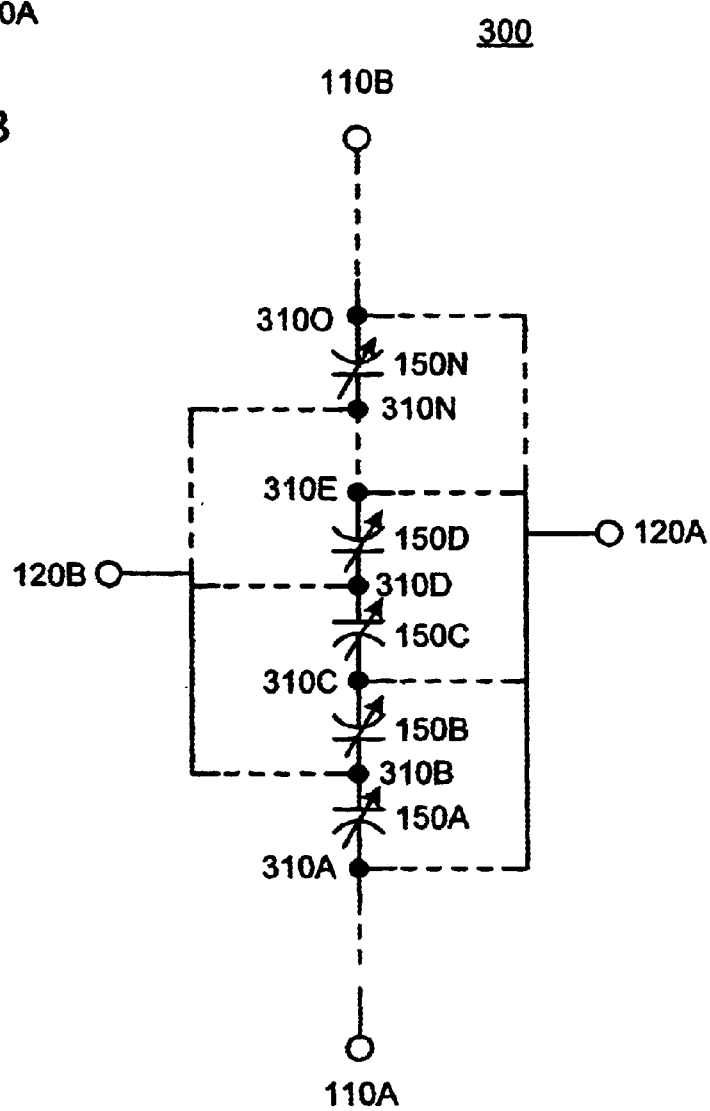
FIG. 3 is a circuit diagram of one general approach to implementing the capacitive element described in FIGS. 1–2.

FIG. 3 is a circuit diagram of one general approach 300 to implementing capacitive element 100. In this approach, the varactors 150A–N are coupled in series to form a chain. The chain itself has N+1 nodes 310: the N-1 nodes 310B–310N located between the varactors and the two nodes 310A and 310O located on either end of the chain. For convenience, these nodes 310 shall be referred to as junction nodes. One of the AC nodes 110A is coupled to the first junction node 310A and the last junction node 310O is coupled to the other AC node 110B. Each DC bias node 120 is DC coupled to alternate junction nodes 310. In FIG. 3, DC bias node 120A is DC coupled to the odd-numbered junction nodes (i.e., nodes 310A, 310C, 310E, etc.) and DC bias node 120B is DC coupled to the even-numbered junction nodes (i.e., nodes 310B, 310D, etc.). The couplings between nodes 110, 120 and junction nodes 310 may includes additional elements (as generally represented by the dashed lines), for example to provide isolation between the DC and AC portions of the capacitive element 300.

Figure 4:
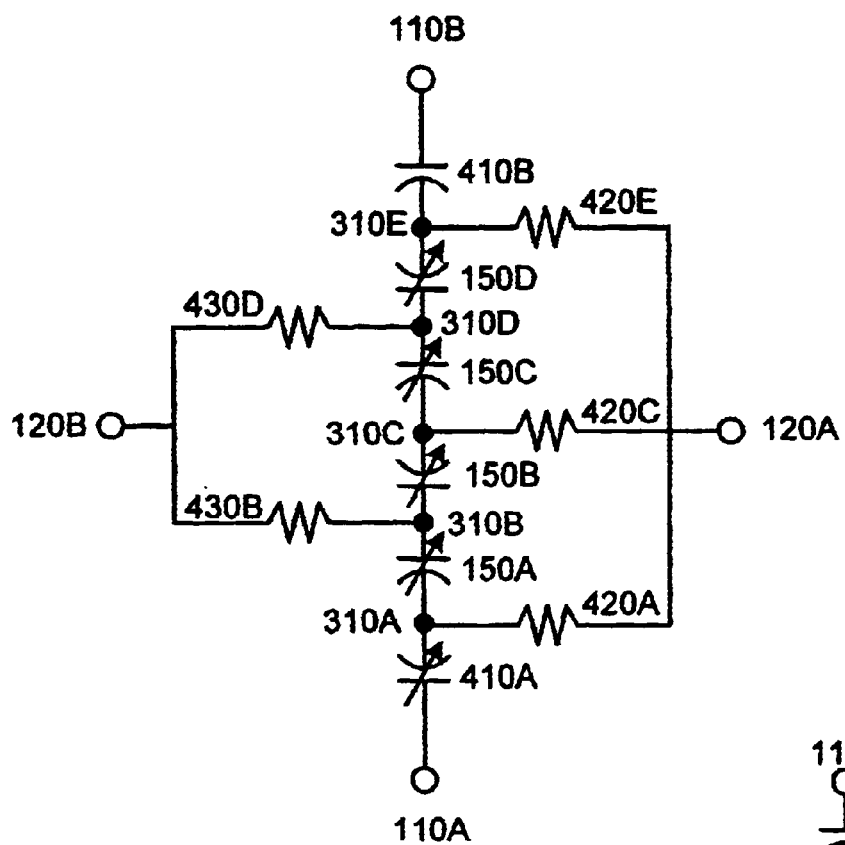
FIG. 4 is a circuit diagram of a capacitive element with four varactors and using resistors as AC blocking circuit elements.

FIG. 4 is a specific example of capacitive element 300 using four varactors 150A–D, two capacitors 410A,B as DC blocking circuit elements and five resistors 420A,C,E and 430B,D as AC blocking circuit elements. The four varactors 150 are coupled in series to form a chain, as described in FIG. 3. Each end of the varactor chain (i.e., junction nodes 310A and 310E) is coupled to one of the AC nodes 110A, 110B by one of the DC blocking capacitors 410A,410B. The DC bias nodes 120A,120B are coupled to alternate junction nodes by the bias resistors 420 and 430. More specifically, DC bias node 120A is coupled to junction nodes 310A,C,E by bias resistors 420A,C,E; and DC bias node 120B is coupled to junction nodes 310B,D by bias resistors 420B,D.

The capacitive element in FIG. 4 functions as follows. With respect to the AC signal applied to AC nodes 110, the bias resistors 420,430 have high resistance and effectively impede AC current flow through these portions of the circuit. As a result, to the AC signal, the capacitive element behaves like six capacitors 410, 150 coupled in series, thus approximating the AC model shown in FIG. 2A. With respect to the DC bias voltage applied across DC bias nodes 120, the varactors 150 and DC blocking capacitors 410 effectively impede DC current flow through these portions of the circuit. As a result, there is a negligible voltage drop across the bias resistors 420, 430 and each varactor 150 is biased by approximately the full DC bias voltage since the DC bias nodes 120 are coupled to alternating junction nodes 310. This approximates the DC model shown in FIG. 2B. In addition, the DC blocking capacitors 410 effectively isolate the DC bias circuitry from any external circuit connected to the AC nodes 110, thus preventing interference between these two circuits.

Figure 5:
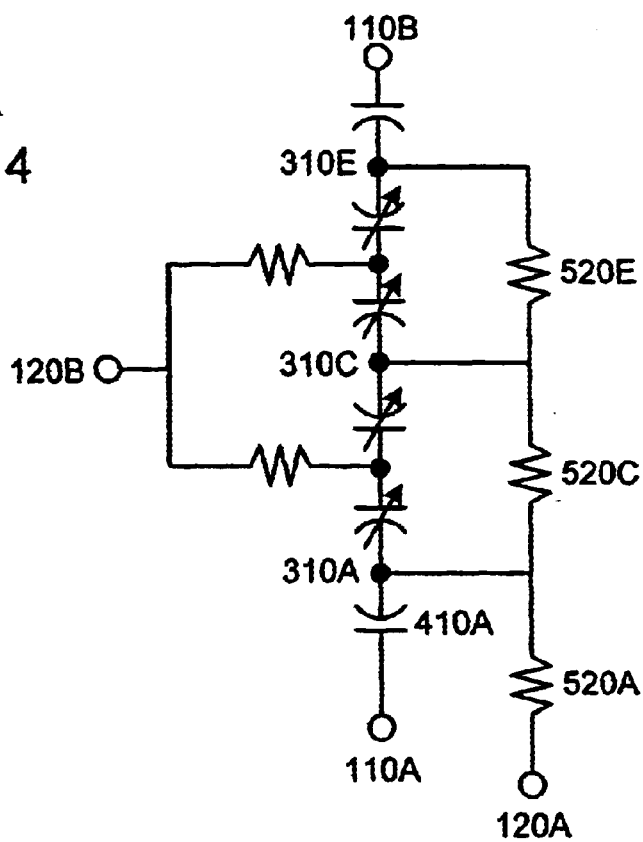
FIG. 5 is a circuit diagram of another capacitive element with four varactors and using resistors as AC blocking circuit elements.

Variations on the DC biasing scheme will be apparent. For example, FIG. 5 is a circuit diagram of another capacitive element in which the DC bias resistors 520 are arranged differently. Rather than coupling each junction node 310A, C,E directly to DC bias node 120A via a bias resistor, the bias resistors 520 are used to couple between the junction nodes 310A,C,E. More specifically, resistor 520A couples the DC bias node 120A to junction node 310A, resistor 520C couples junction node 310A to 310C and resistor 520E couples junction node 310C to 310E. However, the bias resistors 520 generally perform the same function as in FIG. 4. They impede AC current flow and distribute the DC bias voltage to alternate junction nodes.

Figure 6:
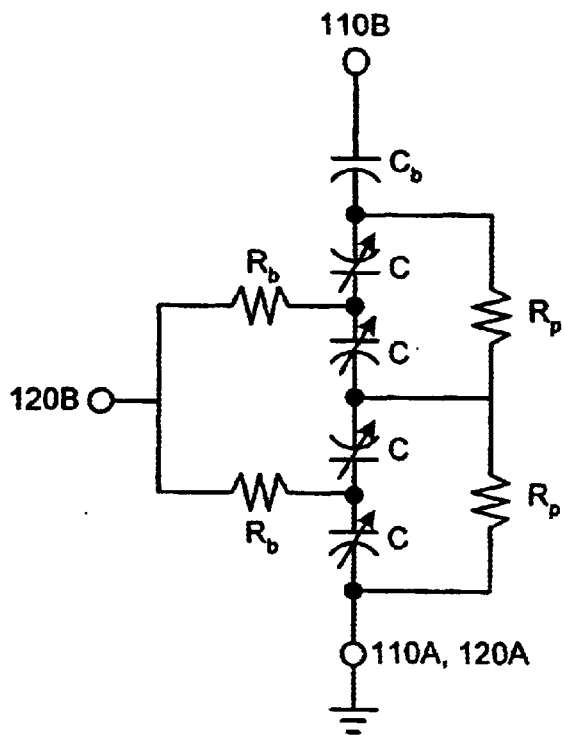
FIG. 6 is a circuit diagram of a capacitive element used in a shunt configuration.

In FIG. 6, the capacitive element of FIG. 5 is used in a shunt configuration, meaning that one AC node 110A is tied to ground. The AC ground and DC ground are assumed to be the same. As a result, the circuitry can be somewhat simplified. In particular, the DC blocking capacitor 410A is eliminated since DC blocking is not required at the grounded node. Similarly, the bias resistor 520A is also eliminated since AC blocking is not required. The resulting circuit is shown in FIG. 6.

Figure 7:
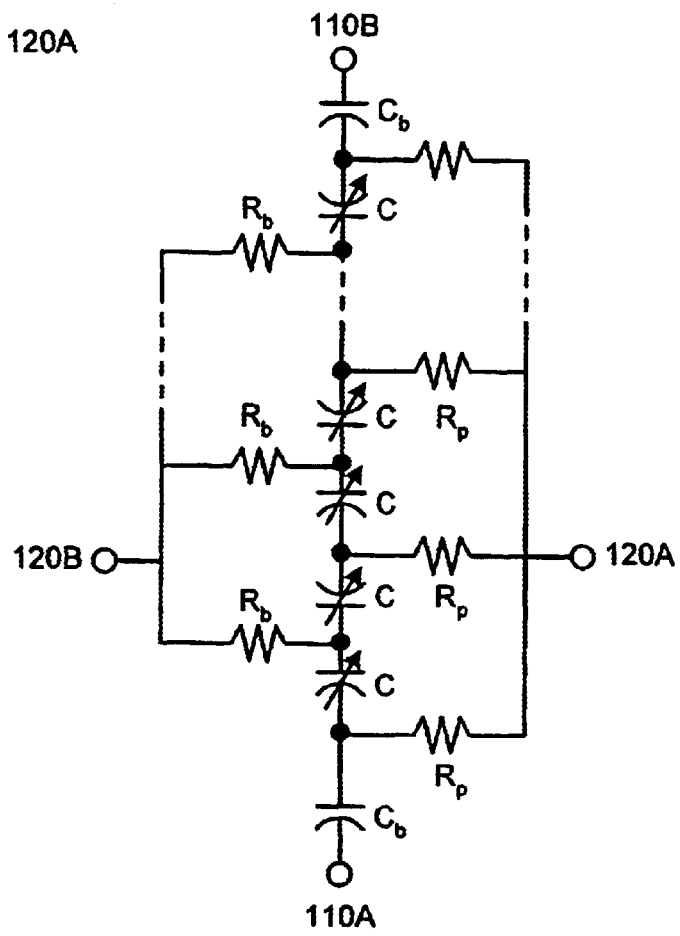
FIG. 7 is a circuit diagram of a capacitive element illustrating the use of any number of varactors in a capacitive element.

FIGS. 4–6 have shown capacitive elements with exactly four varactors. However, as described with respect to FIG. 3, other numbers of varactors can be used. FIG. 7 illustrates how the circuit design of FIG. 4 can be extended to any number of varactors 150. The other circuit designs can be similarly extended.

Figure 8:
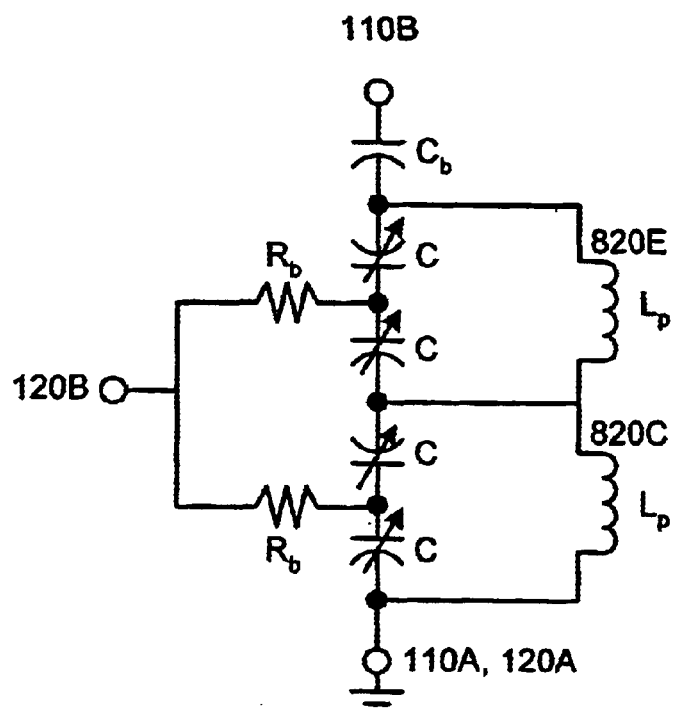
FIG. 8 is a circuit diagram of a capacitive element illustrating the use of inductors as AC blocking circuit elements.

Furthermore, resistors are only one type of circuit element which is AC blocking. Other types of AC blocking circuit elements can also be used. For example, some or all of the resistors shown in FIGS. 3–7 can be replaced by large-value inductors. As one example, the circuit shown in FIG. 8 is the same as that shown in FIG. 6, except that the bias resistors 520C,E are replaced by bias inductors 820C,E.

The capacitive elements described can be implemented using individual discrete components mounted on a separate circuit board or carrier. For example, some thin-film resistor schemes have a limited sheet resistance that makes implementation of large value resistors difficult. In these cases, the resistors can be implemented as discrete components instead.

Preferably, however, the entire capacitive element is implemented as a single integrated circuit, with ferroelectric thin-film technology used to implement the varactors. Standard IC fabrication methods can be used to fabricate the capacitive elements. To reduce costs, inexpensive insulating substrates are preferred, including but not limited to high-resistivity silicon (HR Si), crystalline sapphire ($Al_2O_3$), Aluminum Nitride (AlN), quartz and glass. These substrates are polished for low surface roughness for compatibility with growth of smooth ferroelectric films with high breakdown fields. This approach results in low-cost, small size, reliable components which are suitable for mass production and for integration with additional circuit elements.

Figure 9A:
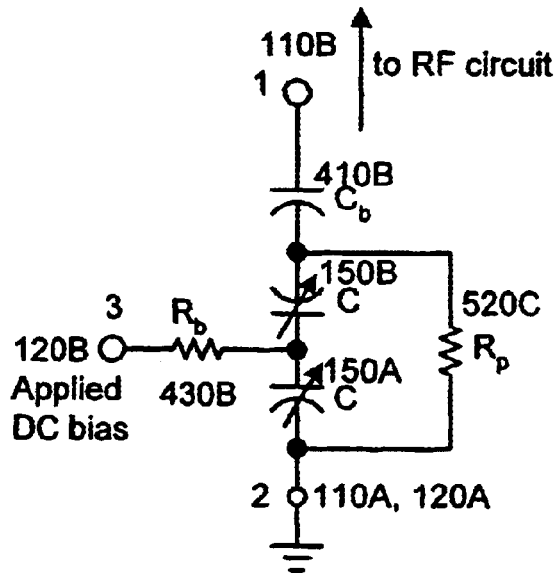
FIG. 9A is a circuit diagram of another capacitive element.
Figure 9B:
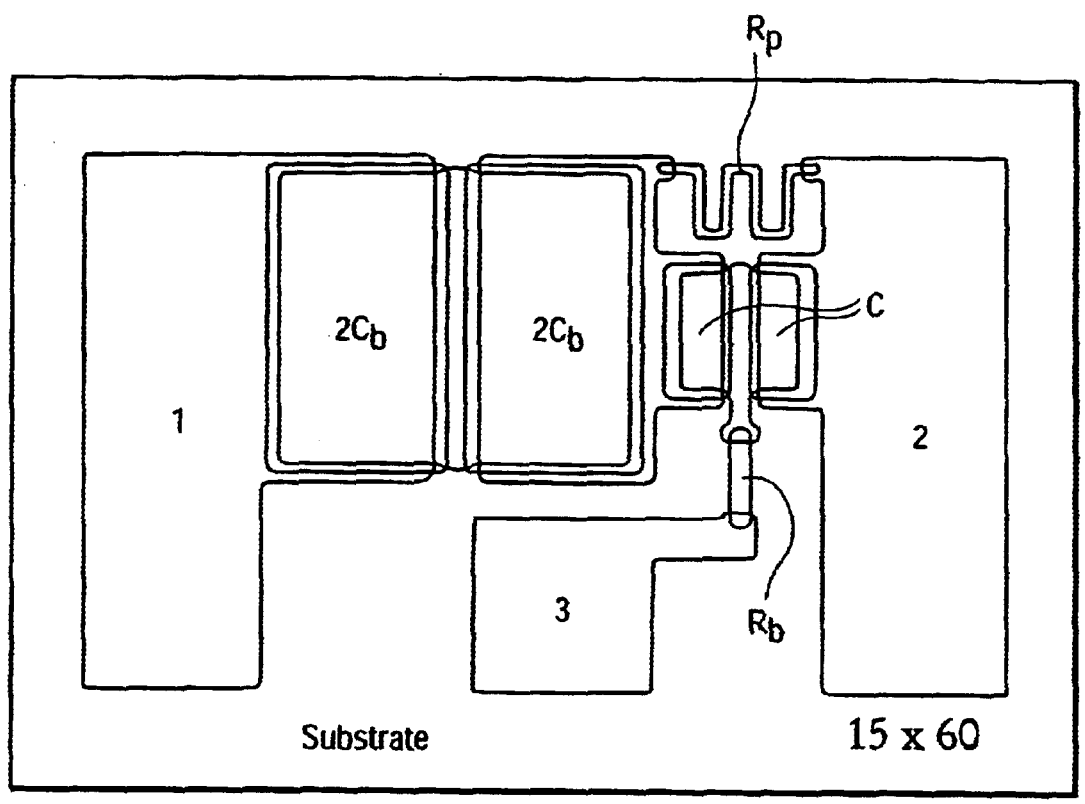
FIG. 9B is a top view of a thin-film integrated circuit implementation of the capacitive element of FIG. 9A.

FIGS. 9A and 9B illustrate a capacitive element which is implemented in this manner. FIG. 9A shows the circuit diagram and FIG. 9B is a top view of the thin-film integrated circuit implementation. FIG. 9B is a line drawing based on a photograph of the actual capacitive element. Referring to FIG. 9A, the circuit implemented is a two-varactor version of the design shown in FIG. 6. As such, there are five circuit elements: two varactors 150A and 150B having capacitance C, two bias resistors 430B and 520C having resistance Rb and Rp respectively, and DC blocking capacitor 410B having capacitance Cb.

Referring to FIG. 9B, the AC and DC bias nodes 110 and 120 are implemented as large metal pads 1, 2 and 3 to allow for interconnection to external elements. The leftmost pad 1 is AC node 110B, the rightmost pad 2 functions as both AC node 110A and DC bias node 120A (i.e., the nodes connected to ground in FIG. 9A), and the bottom pad 3 is DC bias node 120B. These pads can be used for wire-bond attachment or solder-bump attachment, for example.

Beginning with the AC signal path, AC node 110B is connected to AC ground 110A by a DC blocking capacitor 410B and two varactors 150B and 150A coupled in series. In FIG. 9B, this signal path can be seen laid out from left to right. Immediately to the right of the AC node 110B (metal pad 1) are two series-connected capacitors labeled "2 Cb." Each of these capacitors has a capacitance of 2 Cb. Together, they have an effective capacitance of Cb, thus implementing the DC blocking capacitor 410B. The series-connected capacitor pair is used in order to increase the DC breakdown voltage of this element. In this example, the DC blocking capacitors are constructed from the same materials as the varactors, although this is not required.

Since ferroelectric films have a large capacitance density, it is advantageous to use ferroelectric films for the blocking capacitor 410B even though the resulting variation of capacitance with voltage is not necessarily utilized or desired. Large-value blocking capacitors ordinarily consume a large amount of substrate area on a chip, so the use of ferroelectric materials results in a significant reduction in size. Other dielectric materials can also be used for the blocking capacitor, including for example silicon dioxide ($SiO_2$), silicon nitride ($Si_xN_y$), aluminum oxide ($Al_2O_3$) and titanium oxide ($TiO_2$).

The two varactors 150B, 150A are labeled as "C" in FIG. 9B. They are implemented using conventional ferroelectric thin-film technology and typically barium titanate, strontium titanate, or a solid-solution of the two is used as the dielectric.

The capacitance Cb of the blocking capacitor 410B preferably is at least five times greater than the capacitance C of the varactors 150, in order to make effective use of the potential tuning variation of the varactors. In this particular example, the blocking capacitor has a capacitance of at least 20 times the varactor capacitance and the varactors provide a change in capacitance of a factor of 3 in response to DC bias voltages that range from zero volts to near the breakdown voltage of the tunable dielectric material. For many RF applications, the blocking capacitors may be several hundred picoFarads in size, and the capacitance of the varactors may vary by a factor of 2 in response to a DC bias voltage that ranges from 0–5 volts.

The two bias resistors 430B and 520C are implemented using conventional thin-film technology. They are labeled as "Rb" and "Rp," respectively, in FIG. 9B. The resistances preferably are large compared to the reactance of the varactors to insure that negligible AC current flows through these bias resistors.

More specifically, bias resistor 430B preferably has a resistance which is at least ten times greater than the reactance of varactor 150. In other words, $Rb>10/\omega C$, where $\omega$ is the angular frequency of operation. Similarly, bias resistor 520C preferably has a resistance which is at least ten times greater than the reactance of varactor 150, or $Rp>10/\omega C$.

If bias inductors are used in place of bias resistors, a wide range of values may be used. In some applications, it may be desirable to select the inductance to resonate with the varactors at a certain frequency $\omega_0$. In other cases, the bias inductor may function primarily as a choke, in which case the reactance of the inductor should be significantly higher than that of the varactor. For example, the ×10 and ×50 rules of thumb described for resistors may also be applied to inductors.

Although the invention has been described in considerable detail with reference to certain preferred embodiments thereof, other embodiments will be apparent. For example, some implementations do not include blocking capacitors and/or shunt resistors. Referring to FIG. 9A, if AC node 110B is connected to an RF circuit which is at a DC ground potential, then shunt resistor 520C and blocking capacitor 410B can be eliminated. Therefore, the scope of the appended claims should not be limited to the description of the preferred embodiments contained herein.

What is claimed is:

1. A voltage-variable capacitive element comprising:
   a first DC bias node and a second DC bias node for receiving a DC bias voltage;
   a first AC node and a second AC node for receiving an AC signal;
   N parallel-plate varactors, wherein N is at least two and each varactor has a capacitance that varies according to a voltage applied across the varactor, each varactor comprising a top electrode, a bottom electrode and a thin film of ferroelectric material sandwiched between the top electrode and the bottom electrode, wherein the N varactors are coupled in parallel between the DC bias nodes with respect to the DC bias voltage and are coupled in series between the AC nodes with respect to the AC signal; and
   a substrate, wherein the DC bias nodes, the AC nodes and the N varactors are integrated on the substrate.

2. The voltage-variable capacitive element of claim 1 wherein:
   the N varactors are coupled in series to form a chain with N+1 junction nodes;
   the first AC node is coupled to the first junction node;

the N+1th junction node is coupled to the second AC node;

the first DC bias node is DC coupled to the odd numbered junction nodes; and the second DC bias node is DC coupled to the even numbered junction nodes.

3. The voltage-variable capacitive element of claim 2 further comprising: a first set of AC blocking circuit elements that DC couple the first DC bias node to each of the odd numbered junction nodes; and a second set of AC blocking circuit elements that DC couple the second DC bias node to each of the even numbered junction nodes.

4. The voltage-variable capacitive element of claim 3 wherein the AC blocking circuit elements of at least one of the sets consists of resistors integrated on the substrate.

5. The voltage-variable capacitive element of claim 3 wherein the AC blocking circuit elements of at least one of the sets consists of inductors.

6. The voltage-variable capacitive element of claim 2 further comprising:

a bias resistor coupled between one of the DC bias nodes and one of the junction nodes,
wherein a resistance of the bias resistor is significantly larger than a reactance of the varactors coupled to said junction node.

7. The voltage-variable capacitive element of claim 6 wherein:

the resistance of the bias resistor is at least 10 times greater than the reactance of the varactors coupled to said junction node; and the bias resistor is integrated on the substrate.

8. The voltage-variable capacitive element of claim 1 wherein the ferroelectric material comprises at least one material selected from the group consisting of barium titanate, strontium titanate and barium strontium titanate.

9. The voltage-variable capactive element of claim 8 wherein the substrate comprises at least one material selected from the group consisting of high-resistivity silicon (HR Si), crystalline sapphire ($Al_2O_3$), aluminum nitride (AlN), quartz and glass.

10. The voltage-variable capacitive element of claim 2 further comprising:

a bias inductor coupled between one of the DC bias nodes and one of the junction nodes,
wherein a reactance of the bias inductor is significantly larger than a reactance of the varactors coupled to said junction node.

11. The voltage-variable capacitive element of claim 10 wherein an inductance of the bias inductor is selected so that, at a predefined frequency, the bias inductor resonates with the varactors coupled to said junction node.

12. The voltage-variable capacitive element of claim 10 wherein:

the reactance of the bias inductor is at least 10 times greater than the reactance of the varactors coupled to said junction node.

13. The voltage-variable capacitive element of claim 2 further comprising:

a DC blocking capacitor coupled between the N+1th junction node and the second AC node.

14. The voltage-variable capacitive element of claim 2 further comprising:

a first set of AC blocking circuit elements that DC couple the first DC bias node to each of the odd numbered junction nodes, wherein the first DC bias node is coupled to ground;

a second set of AC blocking circuit elements that DC couple the second DC bias node to each of the even numbered junction nodes; and a DC blocking capacitor coupled between the N+1th junction node and the second AC node; and wherein the first AC node is coupled to ground and the first junction node is coupled to ground.

15. The voltage-variable capacitive element of claim 2 further comprising:

a first set of AC blocking circuit elements that DC couple the first DC bias node to each of the odd numbered junction nodes, wherein the first DC bias node is coupled to ground;

a second set of AC blocking circuit elements that DC couple the second DC bias node to each of the even numbered junction nodes; and a first DC blocking capacitor coupled between the first AC node and the first junction node; and a second DC blocking capacitor coupled between the N+1th junction node and the second AC node.

16. The voltage-variable capactive element of claim 1 wherein:

the N parallel-plate varactors are organized as N/2 pairs of parallel plate varactors; and within each pair of parallel plate varactors, the top electrode and/or the bottom electrode for both varactors in the pair is comprised of a contiguous layer of material.

17. The voltage-variable capactive element of claim 13 wherein the DC blocking capacitor comprises a top electrode, a bottom electrode and a thin film of the ferroelectric material sandwiched between the top electrode and the bottom electrode, and the DC blocking capacitor is integrated on the substrate.

18. The voltage-variable capacitive element of claim 1 wherein the AC signal lies in the RF spectrum.

19. The voltage-variable capacitive element of claim 1 further comprising:

a battery for producing the DC bias voltage.

20. An RF power amplifier comprising a tunable reactive matching network, the tunable reactive matching network comprising:

N parallel-plate varactors, wherein N is at least two and each varactor has a capacitance that varies according to a voltage applied across the varactor, each varactor comprising a top electrode, a bottom electrode and a thin film of ferroelectric material sandwiched between the top electrode and the bottom electrode;

a first DC bias node and a second DC bias node for receiving a DC bias voltage, wherein the N varactors are coupled in parallel between the DC bias nodes with respect to the DC bias voltage; and a first AC node and a second AC node for receiving an AC signal, wherein the N varactors are coupled in series between the AC nodes with respect to the AC signal; and a substrate, wherein the DC bias nodes, the AC nodes and the N varactors are integrated on the substrate.

21. An RF tunable filter comprising:

N parallel-plate varactors, wherein N is at least two and each varactor has a capacitance that varies according to a voltage applied across the varactor, each varactor comprising a top electrode, a bottom electrode and a thin film of ferroelectric material sandwiched between the top electrode and the bottom electrode;

a first DC bias node and a second DC bias node for receiving a DC bias voltage, wherein the N varactors are coupled in parallel between the DC bias nodes with respect to the DC bias voltage; and a first AC node and a second AC node for receiving an AC signal, wherein the N varactors are coupled in series between the AC nodes with respect to the AC signal; and a substrate, wherein the DC bias nodes, the AC nodes and the N varactors are integrated on the substrate.

22. A voltage-variable capacitive element comprising:

a first DC bias node and a second DC bias node for receiving a DC bias voltage;

a first AC node and a second AC node for receiving an AC signal;

N parallel-plate varactors, wherein N is at least two and each varactor has a capacitance that varies according to a voltage applied across the varactor, each varactor comprising top electrode, a bottom electrode and a thin film of ferroelectric material sandwiched between the top electrode and the bottom electrode;

AC coupling means for coupling the N varactors in series between the AC nodes with respect to the AC signal; and DC coupling means for coupling the N varactors in parallel between the DC bias nodes with respect to the DC bias voltage.

23. The voltage-variable capacitive element of claim 22 wherein:

the AC coupling means couples the N varactors in series to form a chain with N+1 junction nodes, couples the first AC node to the first junction node, and couples the N+1th junction node to the second AC node; and the DC coupling means DC couples the first DC bias node to the odd numbered junction nodes, and DC couples the second DC bias node to the even numbered junction nodes.

24. The voltage-variable capacitive element of claim 23 further comprising:

DC blocking means coupled between the N+1th junction node and the second AC node.

25. The voltage-variable capacitive element of claim 23 further comprising:

DC blocking means coupled between the N+1th junction node and the second AC node;

wherein the first DC bias node, the first AC node and the first junction node are all coupled to ground.

26. The voltage-variable capacitive element of claim 23 further comprising:

first DC blocking means coupled between the first AC node and the first junction node; and second DC blocking means coupled between the N+1th junction node and the second AC node.

* * * * *